(12) United States Patent (10) Patent No.: US 12,062,583 B2
Ng et al. (45) Date of Patent: Aug. 13, 2024

(54) OPTICAL METROLOGY MODELS FOR IN-LINE FILM THICKNESS MEASUREMENTS

(71) Applicant: Applied Materials Israel Ltd., Rehovot (IL)

(72) Inventors: Eric Chin Hong Ng, Milpitas, CA (US); Edward Budiarto, Fremont, CA (US); Sergey Starik, Kyiv (UA); Todd J. Egan, Fremont, CA (US)

(73) Assignee: Applied Materials Israel Ltd., Rehovot (IL)

( * ) Notice: Subject to any disclaimer, the term of this patent is extended or adjusted under 35 U.S.C. 154(b) by 798 days.

(21) Appl. No.: 17/198,913

(22) Filed: Mar. 11, 2021

(65) Prior Publication Data

US 2022/0290974 A1 Sep. 15, 2022

(51) Int. Cl.
*H01L 21/66* (2006.01)
*G01B 11/06* (2006.01)
(Continued)

(52) U.S. Cl.
CPC .......... *H01L 22/12* (2013.01); *G01B 11/0625* (2013.01); *G01B 11/0633* (2013.01);
(Continued)

(58) Field of Classification Search
CPC ..... H01L 22/12; H01L 22/20; G01B 11/0625; G01B 11/0633; G01B 11/0641;
(Continued)

(56) References Cited

U.S. PATENT DOCUMENTS 5,835,225 A * 11/1998 Thakur .............. G05D 23/1919
374/E11.02
9,625,823 B1 * 4/2017 Kaack ....................... G03F 7/70
(Continued)

FOREIGN PATENT DOCUMENTS

WO 96/03615 A1 2/1996

OTHER PUBLICATIONS

International Preliminary Report on Patentability for Application No. PCT/US2022/016664, mailed Sep. 21, 2023, 6 pages.
(Continued)

*Primary Examiner* — Michelle M Iacoletti
*Assistant Examiner* — Noah J. Haney
(74) *Attorney, Agent, or Firm* — Kilpatrick Townsend & Stockton LLP

(57) ABSTRACT

An optical metrology model for in-line thickness measurements of a film overlying non-ideal structures on a substrate is generated by performing pre-measurements prior to deposition of the film and performing post-measurements after the deposition. The pre- and post-measurements are performed at at least one of multiple polarization angles or multiple orientations of the substrate. Differences in reflectance between the pre- and post-measurements are determined at the multiple polarization angles and the multiple orientations. At least one of the multiple polarization angles or the multiple orientations are identified where the differences in reflectance are indicative of a suppressed influence from the non-ideal structures. The optical metrology model is generated using the identified polarization angles and the identified orientations as inputs to a machine-learning algorithm.

19 Claims, 14 Drawing Sheets

(51) Int. Cl.
*G01N 21/21* (2006.01)
*G06N 20/00* (2019.01)

(52) U.S. Cl.
CPC ........ *G01B 11/0641* (2013.01); *G01B 11/065* (2013.01); *G01B 11/0683* (2013.01); *G06N 20/00* (2019.01); *H01L 22/20* (2013.01); *G01B 2210/56* (2013.01); *G01N 21/211* (2013.01); *G01N 2021/213* (2013.01)

(58) Field of Classification Search
CPC .............. G01B 11/065; G01B 11/0683; G01B 2210/56; G06N 20/00; G01N 2021/213; G01N 21/9501; G01N 21/211; G01N 21/21; G01N 21/55; G01N 2021/212; G01N 2021/214; G01N 2021/215; G01J 4/00; G01J 4/04; G03F 7/70605; G03F 7/70608; G03F 7/70616; G03F 7/70625; G03F 7/70633; G03F 7/7065; G03F 7/70653; G03F 7/70681; G03F 7/706831; G03F 7/706833; G03F 7/706835; G03F 7/706837; G03F 7/706839; G03F 7/706841
USPC .................................................. 356/369, 630
See application file for complete search history.

(56) References Cited

U.S. PATENT DOCUMENTS

| | | | |
|---|---|---|---|
| 2002/0105646 A1* | 8/2002 | Zhao | G01N 21/956 356/369 |
| 2004/0233439 A1 | 11/2004 | Mieher et al. | |
| 2007/0012337 A1* | 1/2007 | Hillman | H01L 21/02101 700/121 |
| 2011/0102793 A1 | 5/2011 | Straaijer | |
| 2011/0125458 A1 | 5/2011 | Xu et al. | |
| 2011/0265578 A1 | 11/2011 | Johnson et al. | |
| 2014/0191374 A1* | 7/2014 | Strocchia-Rivera | H01L 29/06 257/622 |
| 2015/0203966 A1* | 7/2015 | Budiarto | H01J 37/32972 118/712 |
| 2017/0016715 A1* | 1/2017 | Heidrich | G06T 7/0004 |
| 2017/0061604 A1* | 3/2017 | Pandev | G03F 7/70625 |
| 2018/0051984 A1* | 2/2018 | Shchegrov | G03F 7/70141 |
| 2019/0033211 A1* | 1/2019 | Neil | G01N 21/4788 |
| 2019/0094711 A1* | 3/2019 | Atkins | G01N 21/211 |
| 2019/0391088 A1* | 12/2019 | Lynch | G01B 11/0608 |
| 2023/0023634 A1* | 1/2023 | Bringoltz | G06N 3/04 |

OTHER PUBLICATIONS

International Search Report and Written Opinion for Application No. PCT/US2022/016664, mailed May 24, 2022, 14 pages.

* cited by examiner

OPTICAL METROLOGY MODELS FOR IN-LINE FILM THICKNESS MEASUREMENTS

TECHNICAL FIELD

Embodiments described herein relate generally to optical metrology models for in-line film thickness measurements, and more particularly to optical metrology models for in-line thickness measurements of films overlying non-ideal structures. Some embodiments also relate to using the optical metrology models for monitoring thickness of a film deposition process.

BACKGROUND

Control of some semiconductor manufacturing processes requires precise film thickness measurements. Optical metrology tools, such as spectroscopic reflectometers and ellipsometers, may be used to measure film thickness for process diagnostics and control. Film thickness measurements are often performed on test substrates or on metrology pads of device substrates. The metrology pads are typically located on a scribe line and generally have simplified film stacks and no underlying structures (or known underlying structures with minimal variation). Film thickness is typically not measured in-line (e.g., within a device area of a product substrate) because film stacks are more complex and often include underlying structures having variable shapes, sizes, and spacing. This variability can increases correlation error of the film thickness measurements.

Robust models and metrology tools that allow film thickness to be accurately measured within device areas of product substrates are desired.

SUMMARY

Embodiments described herein provide methods and systems (e.g., metrology tools) for generating and using optical metrology models for in-line film thickness measurements. The optical metrology models can enable thickness measurements of films overlying non-ideal structures and/or complex film stacks. The non-ideal structures may include periodic or aperiodic structures having unknown shapes, varying widths and heights, unknown orientations, as well as any other non-ideal or unknown characteristic. The non-ideal structures are formed on substrates such as semiconductor wafers, micro-electromechanical systems (MEMS) substrates, or any other substrate that has micro structures formed thereon. The optical metrology models may be used, for example, for in-line thickness measurements of deposited films (e.g., within a device area of a product substrate). The optical metrology models may be generated using polarization angles, substrate orientations, and/or wavelengths that suppress an impact of the underlying non-ideal structures on film thickness measurements. The optical metrology models may also be generated using polarization angles, substrate orientations, and/or wavelengths that enhance signals from a deposited film (e.g., a measured film) on the film thickness measurements.

In accordance with an embodiment, for example, a method for generating an optical metrology model for in-line thickness measurements of a film overlying non-ideal structures on a semiconductor substrate includes using an optical metrology tool to perform pre-measurements prior to deposition of the film over the non-ideal structures, the pre-measurements comprising exposing multiple areas of interest on the semiconductor substrate to electromagnetic radiation and collecting portions of the electromagnetic radiation reflected from the multiple areas of interest. The multiple areas of interest each include the non-ideal structures, and during the pre-measurements, the multiple areas of interest are exposed to the electromagnetic radiation at at least one of multiple polarization angles of the electromagnetic radiation or multiple orientations of the semiconductor substrate. The method also includes using the optical metrology tool to perform post-measurements after deposition of the film over the non-ideal structures, the post-measurements comprising exposing the multiple areas of interest on the semiconductor substrate to the electromagnetic radiation and collecting portions of the electromagnetic radiation reflected from the multiple areas of interest. During the post-measurements, the multiple areas of interest are exposed to the electromagnetic radiation at the same multiple polarization angles of the electromagnetic radiation used during the pre-measurements and the same multiple orientations of the semiconductor substrate used during the pre-measurements. The method also includes determining differences in reflectance between the collected portions of the electromagnetic radiation reflected from the multiple areas of interest during the pre-measurements and the collected portions of the electromagnetic radiation reflected from the multiple areas of interest during the post-measurements. The differences in reflectance are determined at each of the multiple polarization angles of the electromagnetic radiation and at each of the multiple orientations of the semiconductor substrate. The method also includes identifying at least one polarization angle of the multiple polarization angles of the electromagnetic radiation, and/or at least one orientation of the multiple orientations of the semiconductor substrate, where the differences in reflectance are indicative of a suppressed influence from the non-ideal structures. The method also includes generating the optical metrology model using the identified at least one polarization angle and/or the identified at least one orientation as input to a machine-learning algorithm.

In some embodiments, the method also includes determining, at each of the multiple wavelengths, the differences in reflectance at each of the multiple polarization angles of the electromagnetic radiation and at each of the multiple orientations of the semiconductor substrate; identifying at least one polarization angle of the multiple polarization angles of the electromagnetic radiation, at least one orientation of the multiple orientations of the semiconductor substrate, and/or at least one wavelength of the multiple wavelengths where the differences in reflectance from the non-ideal structures are relatively low and the differences in reflectance from the deposited film are relatively high; and generating the optical metrology model using the identified at least one polarization angle, the identified at least one orientation, and/or the identified at least one wavelength as inputs to a machine-learning algorithm.

In an embodiment, the method also includes using the optical metrology tool with the optical metrology model for monitoring thickness of a film deposition process on semiconductor substrates.

In another embodiment, the non-ideal structures on the semiconductor substrate have at least one of an unknown shape, a varying width, a varying height, or an unknown orientation.

In another embodiment, the optical metrology tool is configured for ellipsometry measurements or reflectometry measurements.

In another embodiment, the multiple polarization angles of the electromagnetic radiation include at least a transverse-electric (TE) polarization state and a transverse-magnetic (TM) polarization state.

In another embodiment, the differences in reflectance are identified based on a predicted measurement uncertainty of multi-parameter inverse-model fitting method.

In yet another embodiment, the differences in reflectance are indicative of a suppressed influence from the non-ideal structures and an enhanced influence from the deposited film.

In accordance with another embodiment, a method for generating an optical metrology model for in-line thickness measurements of films overlying non-ideal structures on semiconductor substrates includes using an optical metrology tool to perform pre-measurements prior to deposition of the film over the non-ideal structures, the pre-measurements comprising exposing multiple areas of interest on the semiconductor substrates to electromagnetic radiation and collecting portions of the electromagnetic radiation reflected from the multiple areas of interest. The multiple areas of interest each include the non-ideal structures, and during the pre-measurements, the multiple areas of interest are exposed to the electromagnetic radiation at at least one of multiple polarization angles of the electromagnetic radiation or multiple orientations of the semiconductor substrates. The method also includes using the optical metrology tool to perform post-measurements after deposition of the film over the non-ideal structures, the post-measurements comprising exposing the multiple areas of interest on the semiconductor substrates to the electromagnetic radiation and collecting portions of the electromagnetic radiation reflected from the multiple areas of interest. During the post-measurements, the multiple areas of interest are exposed to the electromagnetic radiation at the same multiple polarization angles of the electromagnetic radiation used during the pre-measurements and the same multiple orientations of the semiconductor substrates used during the pre-measurements. The method also includes determining differences in reflectance between the collected portions of the electromagnetic radiation reflected from the multiple areas of interest during the pre-measurements and the collected portions of the electromagnetic radiation reflected from the multiple areas of interest during the post-measurements. The differences in reflectance are determined at each of the multiple polarization angles of the electromagnetic radiation and at each of the multiple orientations of the semiconductor substrates. The method also includes identifying at least one polarization angle of the multiple polarization angles of the electromagnetic radiation, and/or at least one orientation of the multiple orientations of the semiconductor substrates, where the differences in reflectance are indicative of a suppressed influence from the non-ideal structures and an enhanced influence from the deposited film. The method also includes generating the optical metrology model using the identified at least one polarization angle and/or the identified at least one orientations as input to a machine-learning algorithm.

In accordance with yet another embodiment, an optical metrology tool is configured to generate an optical metrology model for in-line thickness measurements of a film overlying non-ideal structures on a semiconductor substrate. The optical metrology tool is configured to perform steps comprising performing pre-measurements prior to deposition of the film over the non-ideal structures, the pre-measurements comprising exposing multiple areas of interest on the semiconductor substrate to electromagnetic radiation and collecting portions of the electromagnetic radiation reflected from the multiple areas of interest, wherein the multiple areas of interest each include the non-ideal structures, and during the pre-measurements, the multiple areas of interest are exposed to the electromagnetic radiation at at least one of multiple polarization angles of the electromagnetic radiation or multiple orientations of the semiconductor substrate; performing post-measurements after deposition of the film over the non-ideal structures, the post-measurements comprising exposing the multiple areas of interest on the semiconductor substrate to the electromagnetic radiation and collecting portions of the electromagnetic radiation reflected from the multiple areas of interest, wherein during the post-measurements, the multiple areas of interest are exposed to the electromagnetic radiation at the same multiple polarization angles of the electromagnetic radiation used during the pre-measurements and the same multiple orientations of the semiconductor substrate used during the pre-measurements; determining differences in reflectance between the collected portions of the electromagnetic radiation reflected from the multiple areas of interest during the pre-measurements and the collected portions of the electromagnetic radiation reflected from the multiple areas of interest during the post-measurements, wherein the differences in reflectance are determined at each of the multiple polarization angles of the electromagnetic radiation and at each of the multiple orientations of the semiconductor substrate; identifying at least one polarization angle of the multiple polarization angles of the electromagnetic radiation, and/or at least one orientation of the multiple orientations of the semiconductor substrate, where the differences in reflectance are indicative of a suppressed influence from the non-ideal structures; and generating the optical metrology model using the identified at least one polarization angle and/or the identified at least one orientation as input to a machine-learning algorithm.

Numerous benefits are achieved using embodiments described herein over conventional techniques. For example, some embodiments provide optical metrology models for in-line thickness measurements of films overlying non-ideal structures. The optical metrology models may be generated using measurement conditions that suppress signals from underlying film stacks and non-ideal structures. The optical metrology models may also be generated using measurement conditions that enhance signals from the measured film. This allows film thickness measurements to be made, for example, on device areas (or active areas) of patterned semiconductor wafers. This enables improved process monitoring and control of film deposition processes.

Further aspects, advantages, and features will be apparent from the claims, description, and accompanying drawings.

BRIEF DESCRIPTION OF THE DRAWINGS

The various embodiments described herein, both as to organization and method of operation, together with features and advantages thereof, can best be understood by reference to the following detailed description and accompanying drawings, in which.

Figure 1A:
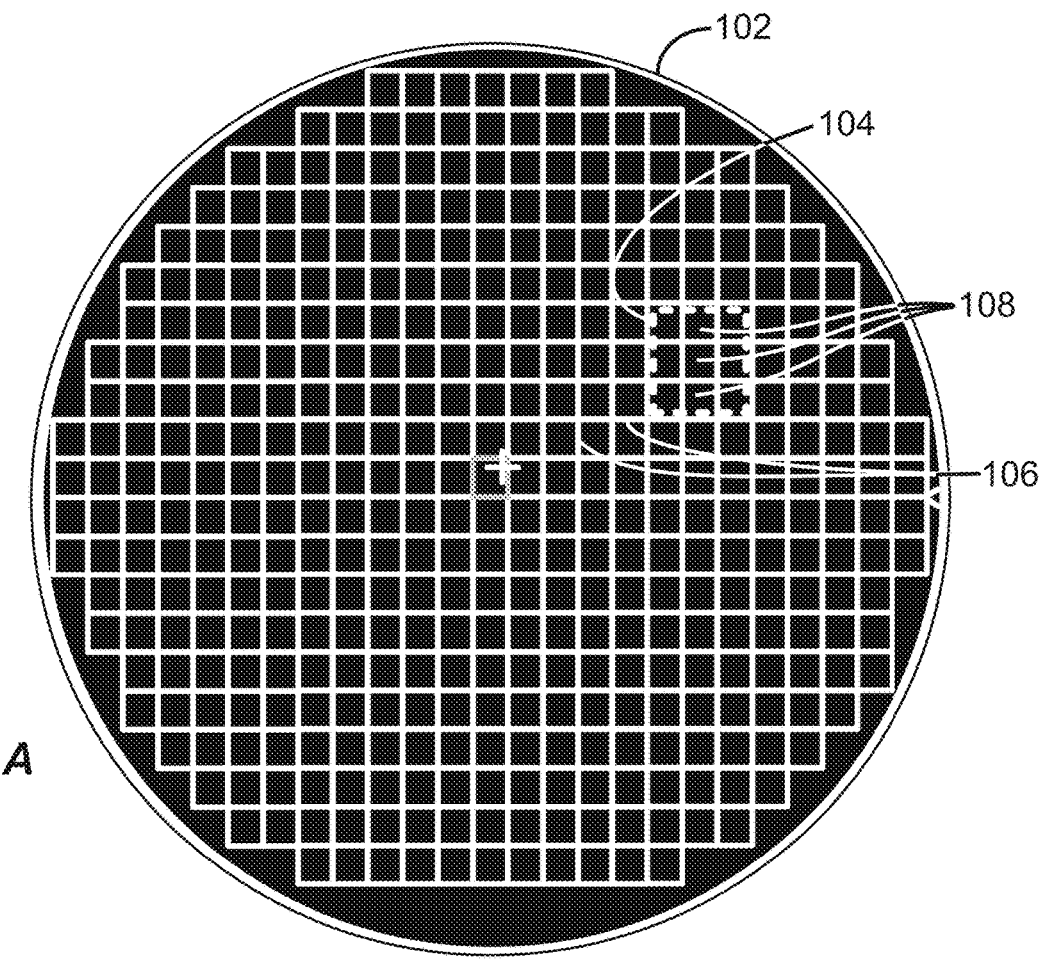
FIGS. 1A-1B are simplified drawings of in-line film thickness measurement locations on a device substrate.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the embodiments described herein. However, it should be understood that the various embodiments can be practiced without these specific details. In other instances, well-known methods, procedures, and components have not been described in detail so as not to obscure the described features.

Reference will be made in detail to the various embodiments, one or more examples of which are illustrated in the figures. Each example is provided by way of explanation and is not meant as a limitation. Further, features illustrated or described as part of one embodiment can be used on or in conjunction with other embodiments to yield yet further embodiments. The description is intended to include these modifications and variations.

A "substrate," "device substrate," "semiconductor substrate," or "sample," as referred to herein, includes, but is not limited to, a semiconductor wafer, a semiconductor work piece, a photolithography mask, a flat panel display substrate, and other work pieces such as a memory disk and the like. According to some embodiments, which can be combined with other embodiments described herein, the systems and methods are configured for or are applied to optical metrology applications, including ellipsometry-based, reflectometry-based, or sequential imaging-based metrology applications.

Embodiments described herein relate generally to generation of optical metrology models for in-line film thickness measurements. In accordance with an embodiment, for example, an optical metrology model may be generated using polarization angles, substrate orientations, and/or wavelengths that suppress an impact of underlying non-ideal structures on film thickness measurements. The optical metrology models may also be generated using polarization angles, substrate orientations, and/or wavelengths that enhance signals from a deposited film (e.g., a measured film) on the film thickness measurements.

Figure 1B:
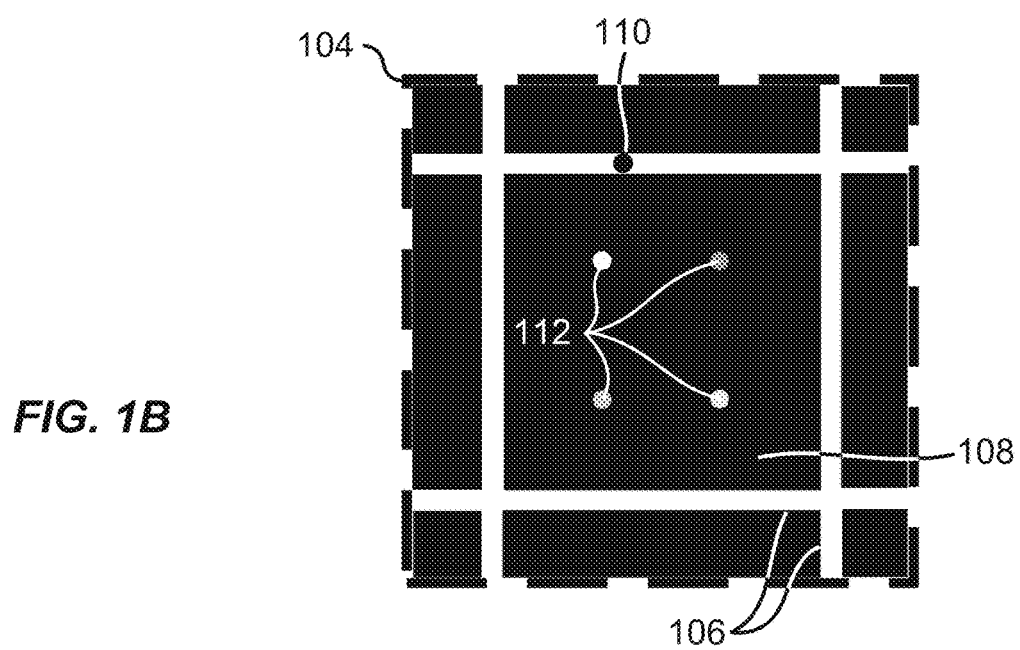

FIGS. 1A-1B are simplified drawings of in-line film thickness measurement locations on a device substrate. FIG. 1A shows an exemplary device substrate 102 having horizontal and vertical scribe lines 106. The horizontal and vertical scribe lines 106 are spaces between die 108 on the device substrate 102. The horizontal and vertical scribe lines 106 allow separation of the die 108 after processing by cutting or sawing. In embodiments where the device substrate 102 is a semiconductor product wafer, for example, each of the die 108 may be an integrated circuit. There are a number of die 108 formed on the device substrate 102. A portion of the device substrate 102 surrounded by dotted line 104 is enlarged in FIG. 1B.

FIG. 1B shows a die 108 bounded by horizontal and vertical scribe lines 106. This enlarged portion of the device substrate 102 shows measurement locations 110 and 112. Measurement location 110 may be a conventional metrology pad located within a horizontal scribe line. The measurement location 110 may be controlled during processing to have a simplified film stack without any underlying structures. Measurement locations 112 represent locations within a device area of the die 108, or a portion of the die 108 where electronic components of the die 108 are formed. The measurement locations 112 typically have more complex film stacks and include underlying structures formed by photolithography and etch processes. The underlying structures may be non-ideal structures in that they may include periodic or aperiodic structures having unknown and/or varying shapes, widths, heights, spacings, orientations, as well as any other unknown or varying characteristic. Embodiments described herein provide robust optical metrology models that enable film thickness measurements at one or more of the measurement locations 112.

Figure 2:
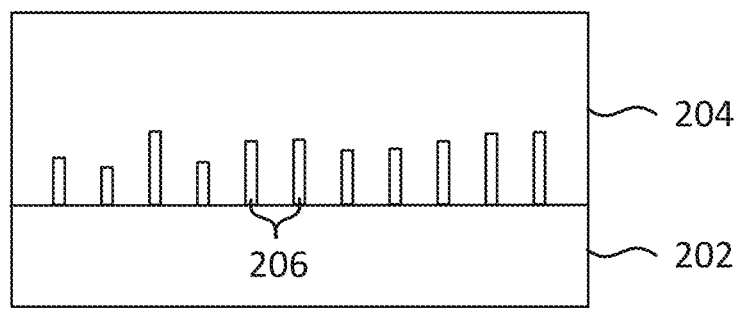
FIGS. 2-3 are simplified cross-sectional views of film stacks having underlying non-ideal structures.
Figure 3:
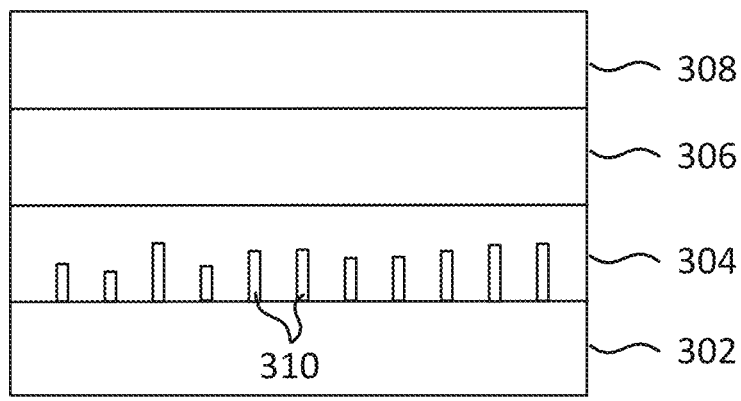

FIGS. 2-3 are simplified cross-sectional views of film stacks having underlying non-ideal structures. FIG. 2 shows a film 204 overlying non-ideal structures 206 on a substrate 202. FIG. 3 shows films 304, 306, 308 each overlying non-ideal structures 310 on a substrate 302. The films 204, 304, 306, 308 may be, for example, any dielectric or conductive film that is deposited or grown during a semiconductor substrate manufacturing process. The non-ideal structures 206, 310 may be lines formed on a surface of the substrates 202, 302, mesas formed between trenches in the substrates 202, 302, or any other structure formed during the manufacturing process. In this example, the non-ideal structures 206, 310 vary in height. If the non-ideal structures 206 and 310 are lines or mesas, an orientation of the lines or mesas may also be unknown.

While a thickness of any of the films 204, 304, 306, 308 may be measured at any stage of processing, film thickness measurements are typically performed on a top-most film of a film stack (e.g., immediately after a film is formed or after a film is exposed following removal of another film). This typically allows for the most accurate film thickness measurements. So a thickness measurement of the film stack shown in FIG. 2 would typically be to measure a thickness of film 204, and a thickness measurement of the film stack shown in FIG. 3 would typically be to measure a thickness of film 308. Variations in the non-ideal structures and in thicknesses and characteristics of underlying films (such as films 304, 306 in FIG. 3) can lead to error in the film thickness measurements.

Figure 4:
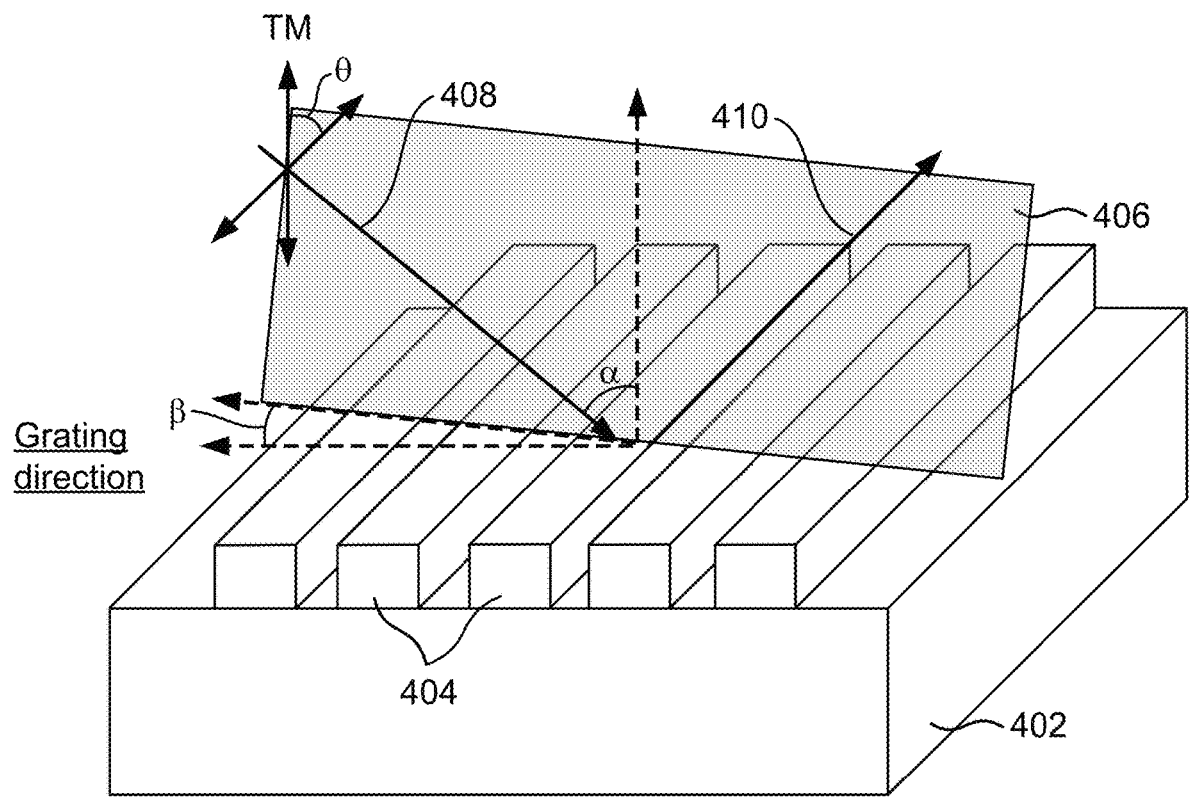
FIG. 4 is a simplified perspective view of structures on a substrate.

FIG. 4 is a simplified perspective view of structures on a substrate. This example shows structures 404 on substrate 402 and provides an illustration of illumination polarization angle θ, incidence angle α, and substrate orientation (or azimuth angle) β. An incident plane 406 is included to assist in the illustration.

Each of the structures 404 has a length, a width, and a height. In this example, a grating direction is identified as being perpendicular to the length of the structures 404. An illumination beam 408 of electromagnetic radiation is incident on the structures 404 and at least a portion of the illumination beam 408 is reflected as reflected beam 410. The illumination beam 408 and the reflected beam 410 are parallel to the incident plane 406.

A spatial relationship between the illumination beam 408 and the structures 404 is defined by the substrate orientation β and the incidence angle α. The illumination beam 408 is characterized by the polarization angle θ (or a direction of a polarized electric field).

A reflectance of the illumination beam 408 depends at least in part on an orientation of the polarization angle θ relative to the grating direction. The reflectance is at or near a minimum (or maximum at different wavelengths) when the polarization angle θ is about 90° (or the polarized electric field is perpendicular to the grating direction). Adjusting the substrate orientation β can alter the reflectance of the illumination beam 408 in a similar manner for symmetrical structures.

Figure 5:
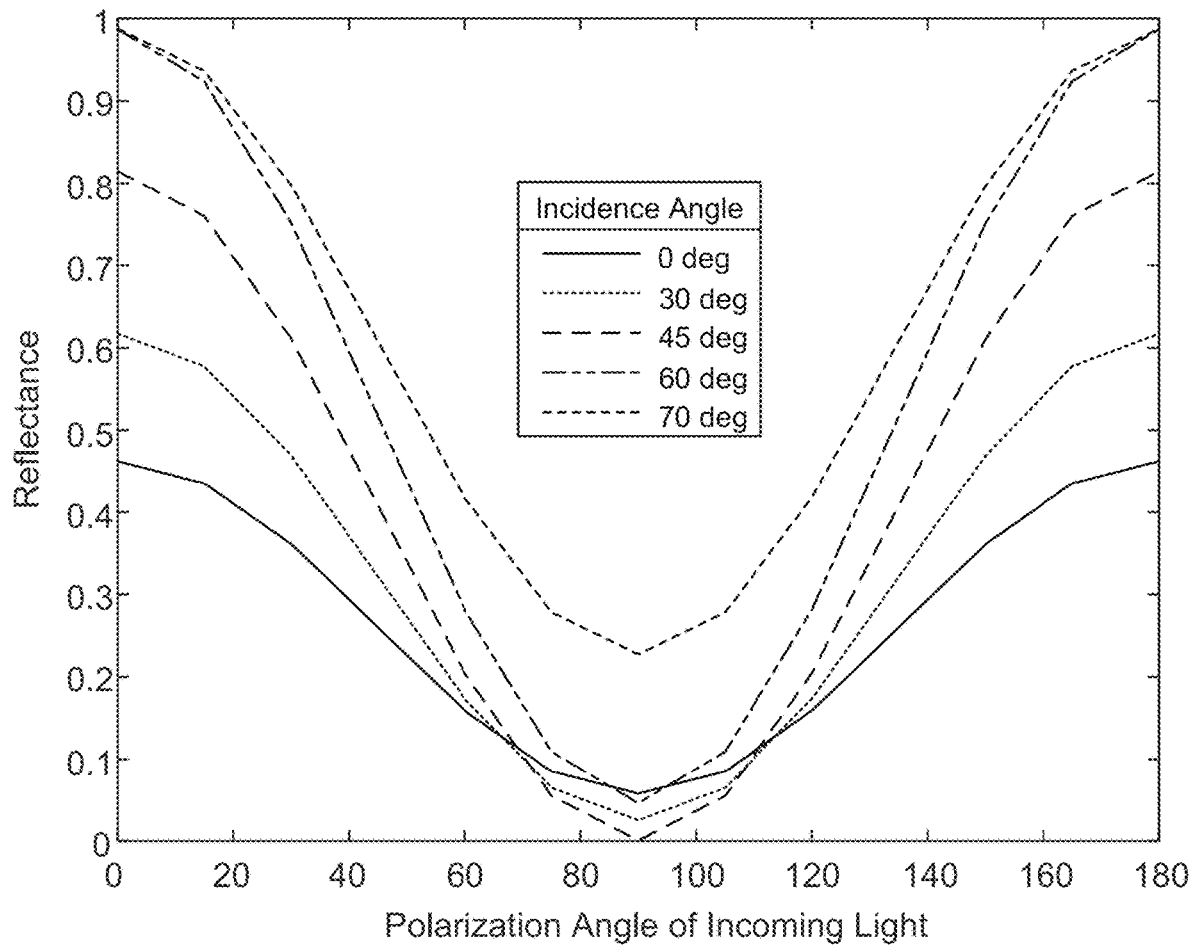
FIG. 5 is a simplified plot showing measured reflectance at different illumination incidence angles as a function of a polarization angle.

FIG. 5 is a simplified plot showing measured reflectance at different illumination incidence angles as a function of polarization angle. This plot is used to illustrate the relationship between reflectance, incidence angle α, and polarization angle θ for a particular illumination beam. The incidence angle α and polarization angle θ are measured using the convention shown in FIG. 4, where an incidence angle α of zero is normal to a surface of the substrate and polarization angle θ of 90° is perpendicular to the grating direction.

As shown in this example, the reflectance increases with increasing incidence angle α. At polarization angles between 0-90°, the reflectance decreases with increasing polarization angle θ, and at polarization angles between 90-180°, the reflectance increases with increasing polarization angle θ (assuming substantially symmetrical structures). Adjusting a substrate orientation β can alter the reflectance in a similar manner. At other wavelengths, phase shift by 90° can be observed as the relative effective refractive indices between layers or media may vary differently.

Figure 6:
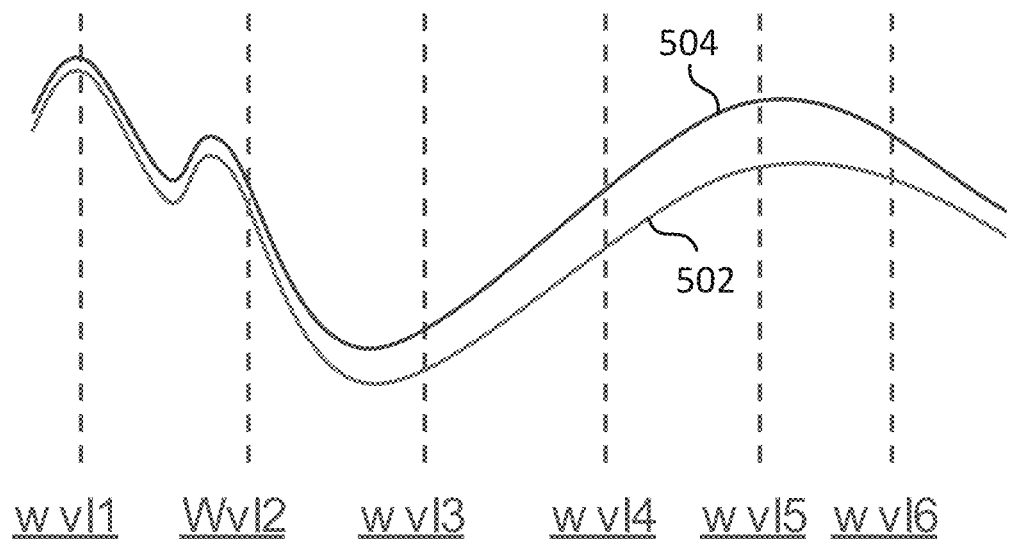
FIG. 6 is a simplified plot showing a change in measured reflectance between pre and post-deposition thickness measurements as a function of illumination wavelength in accordance with an embodiment.

FIG. 6 is a simplified plot showing a change in measured reflectance between pre and post-deposition measurements as a function of illumination wavelength in accordance with an embodiment. In this example, the y-axis is measured reflectance (not separately shown), and the x-axis is wavelength. A broadband light source is used. A first line 502 represents a pre deposition reflectance, and a second line 504 represents a post-deposition reflectance. Assuming the change in measured reflectance is due to the deposited film, wavelength 5 shows the largest magnitude change between pre- and post-measurements. Using wavelength 5 can enhance signals from the deposited film on the film thickness measurements.

Figure 7:
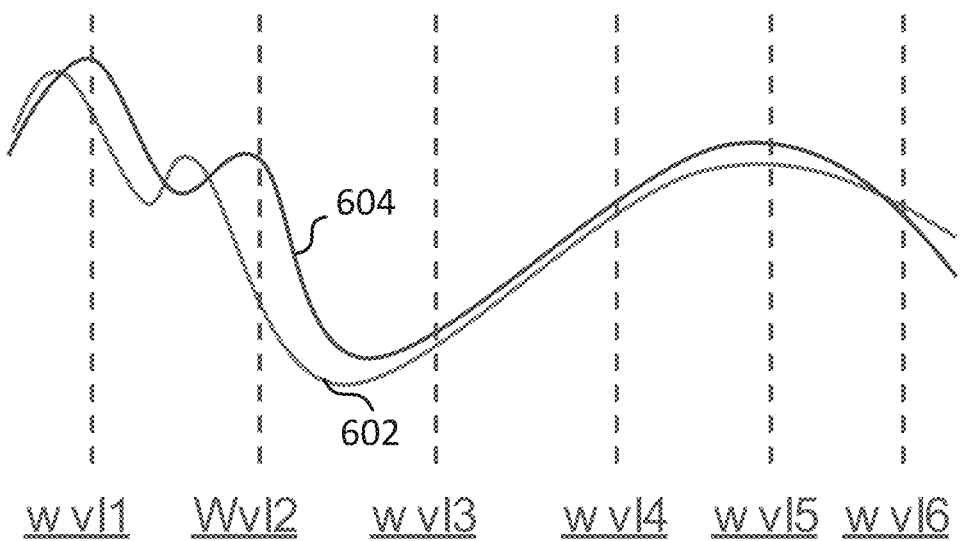
FIG. 7 is a simplified plot showing a change in measured reflectance with different illumination polarizations as a function of illumination wavelength in accordance with an embodiment.

FIG. 7 is a simplified plot showing a change in measured reflectance with different illumination polarizations as a function of illumination wavelength in accordance with an embodiment. This example is similar to FIG. 6 in that the y-axis is measured reflectance (not separately shown), and the x-axis is wavelength. This example is different in that a first line 602 represents measurements at a first polarization angle $\theta_1$ and a second line 604 represents measurements at a second polarization angle $\theta_2$. Wavelength 2 shows the largest magnitude change between pre- and post-measurements. Note the signal response is shifted across the wavelength vector.

Figure 8A:
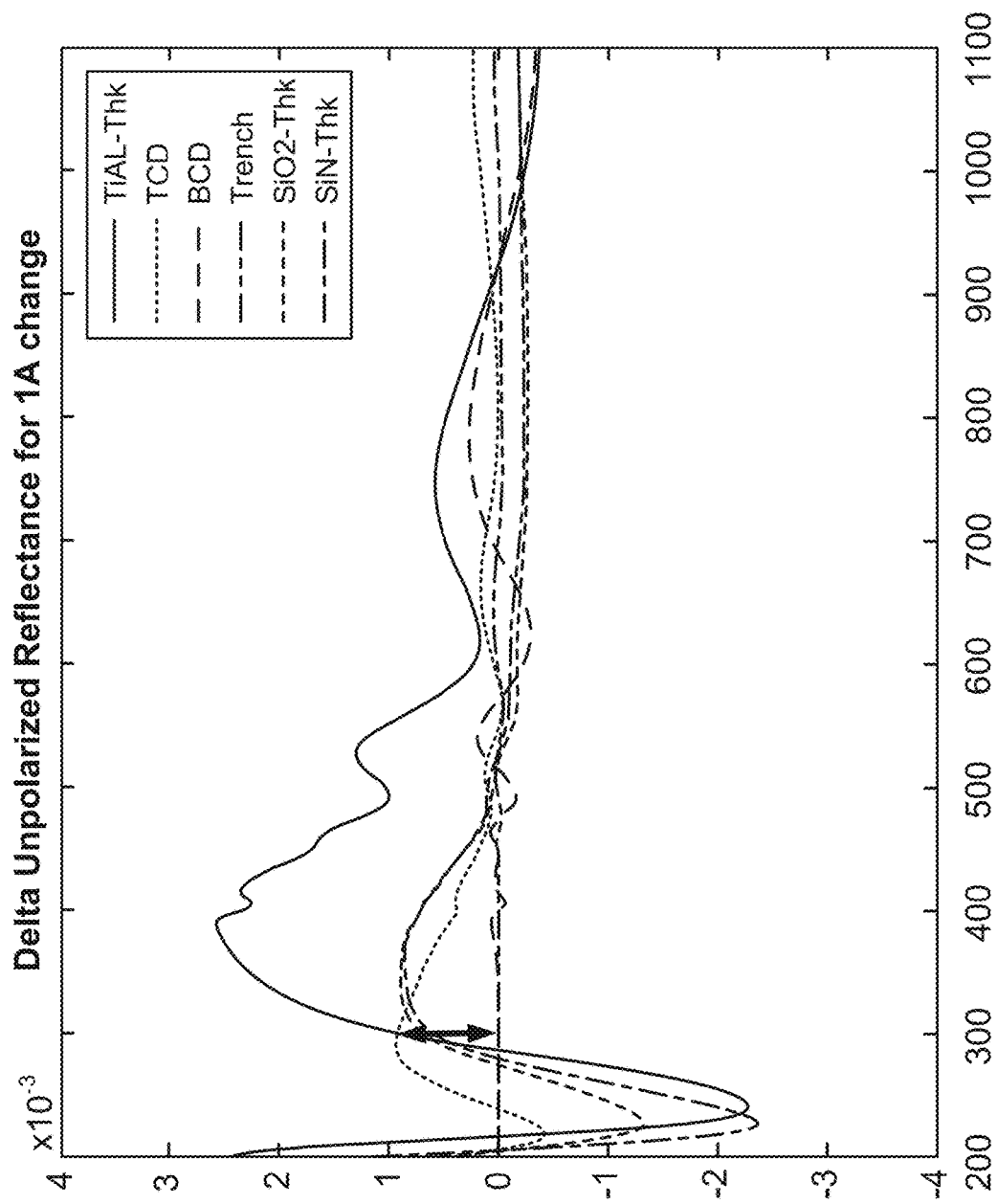
FIGS. 8A-8C are simplified plots showing changes in reflectance between pre and post-film deposition measurements at different polarization angles as a function of wavelength in accordance with some embodiments.
Figure 8B:
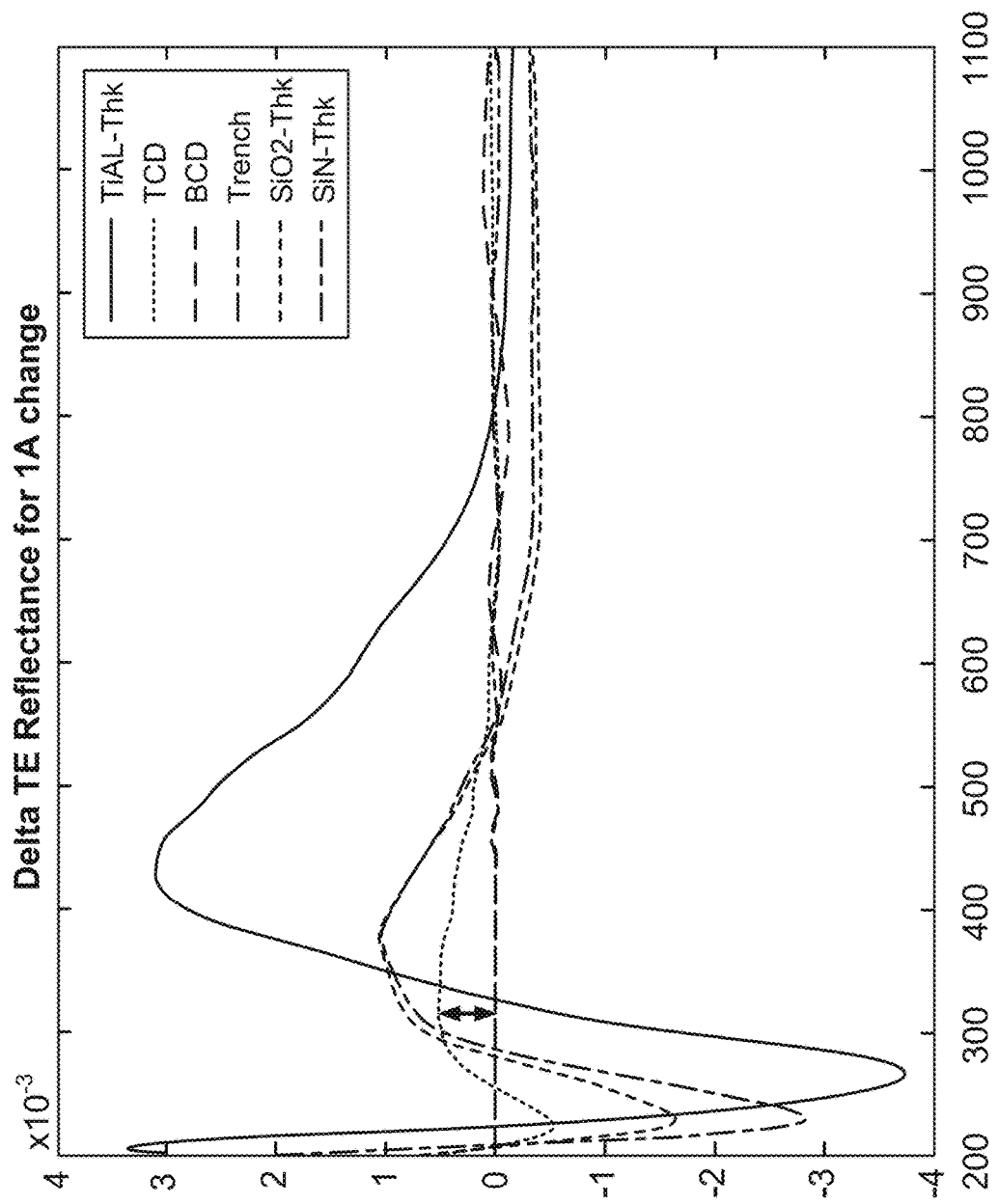
Figure 8C:
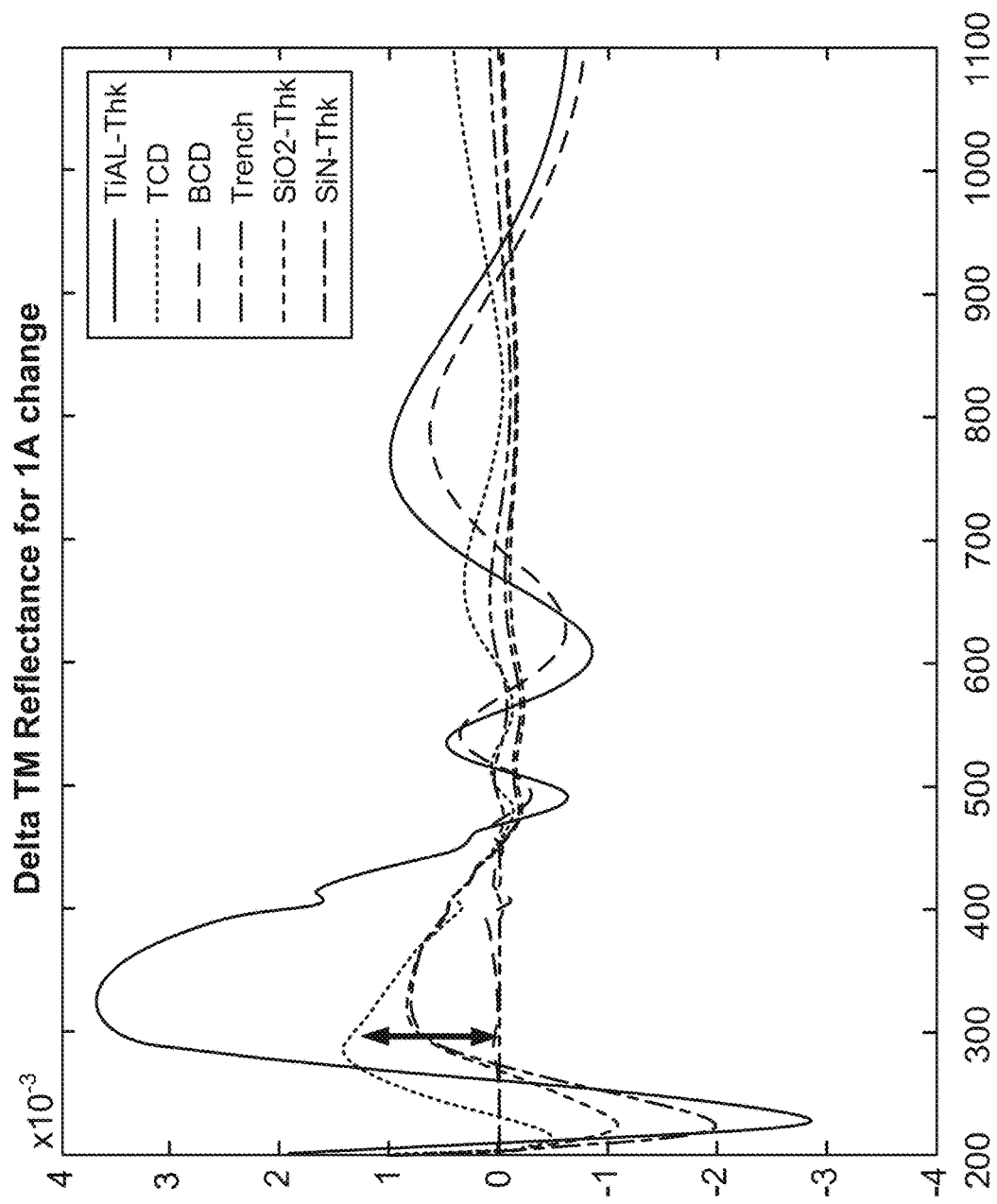

FIGS. 8A-8C are simplified plots showing changes in reflectance between pre and post-film deposition measurements at different polarization angles as a function of wavelength in accordance with some embodiments. The data in this example was obtained by depositing an approximately 1 Å titanium aluminide (TiAl) film over a line structure similar to the structures 404 shown in FIG. 4. The line structure in this example is formed on a silicon (Si) substrate and each line is topped with a silicon nitride film overlying a silicon oxide film. Pre- and post-measurements of the following parameters were obtained and included in the plot as a function of wavelength:

Titanium aluminide thickness (TiAl-Thk)
CD at top of line (TCD)
CD at bottom of line (BCD)
Trench depth (Trench)
Silicon Oxide thickness (SiO2-Thk)
Silicon nitride thickness (SiN-Thk)

Note that the pre- and post-measurements were performed before and after a 1 ÅTiAl film deposition in this example. Even when generating an optical metrology model for monitoring a thicker film, depositing a thin film may be sufficient for determining measurement sensitivities that can be used in a machine-learning algorithm to generate an optical metrology model.

FIG. 8A shows measurements using unpolarized illumination, FIG. 8B shows measurements using transverse electric (TE) polarization, and FIG. 8C shows measurements using transverse magnetic (TM) polarization. In general, measurements at shorter wavelengths (less than about 450) are more sensitive. Note in FIG. 8B, at a wavelength of about 550, there is very little sensitivity to any of the measured parameters except TiAl thickness. Using the conditions of FIG. 8B (TE polarization and 550 wavelength), measurement sensitivity of the underlying structure parameters are suppressed while measurement sensitivity of the TiAl thickness is enhanced.

Figure 9:
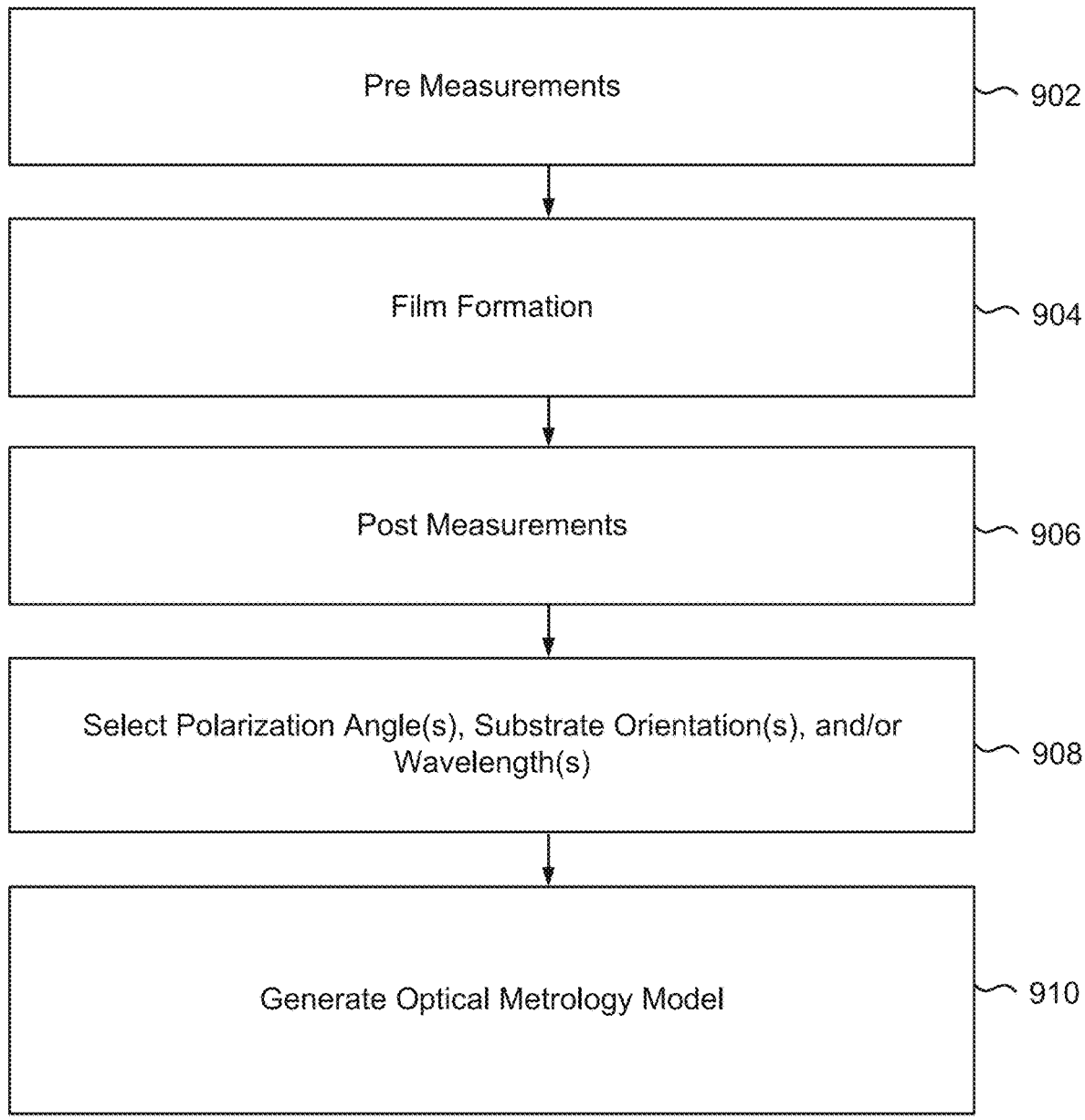
FIG. 9 is a flowchart illustrating a method for generating an optical metrology model for in-line thickness measurements of a film overlying non-ideal structures in accordance with an embodiment.

FIG. 9 is a flowchart illustrating a method for generating an optical metrology model for in-line thickness measurements of a film overlying non-ideal structures in accordance with an embodiment. The method includes performing pre measurements (902), film formation (904), and post-measurements (906). The pre- and post-measurements are performed at different polarization angles, substrate orientations, and/or wavelengths. The pre and post-measurements can be repeated, for example, at different locations within a die of a semiconductor substrate, within different die of a semiconductor substrate, and/or within multiple semiconductor substrates. This captures variation in the underlying non-ideal structures.

The method also includes selecting polarization angle(s), substrate orientation(s), and/or wavelength(s) (908). The polarization angle(s), substrate orientation(s), and/or wavelength(s) may be selected to suppress signals from the underlying non-ideal structures, and/or to enhance signals from the measured film.

The method also include generating the optical metrology model (910). The optical metrology model may be generated using the selected polarization angle(s), substrate orientation(s), and/or wavelength(s), along with other information such as measurements using other metrology tools (e.g., TEM), to train a known machine-learning algorithm and generate the optical metrology model. Note that information about the non-ideal structures is not required to generating the optical metrology model like conventional modeling techniques.

Figure 10:
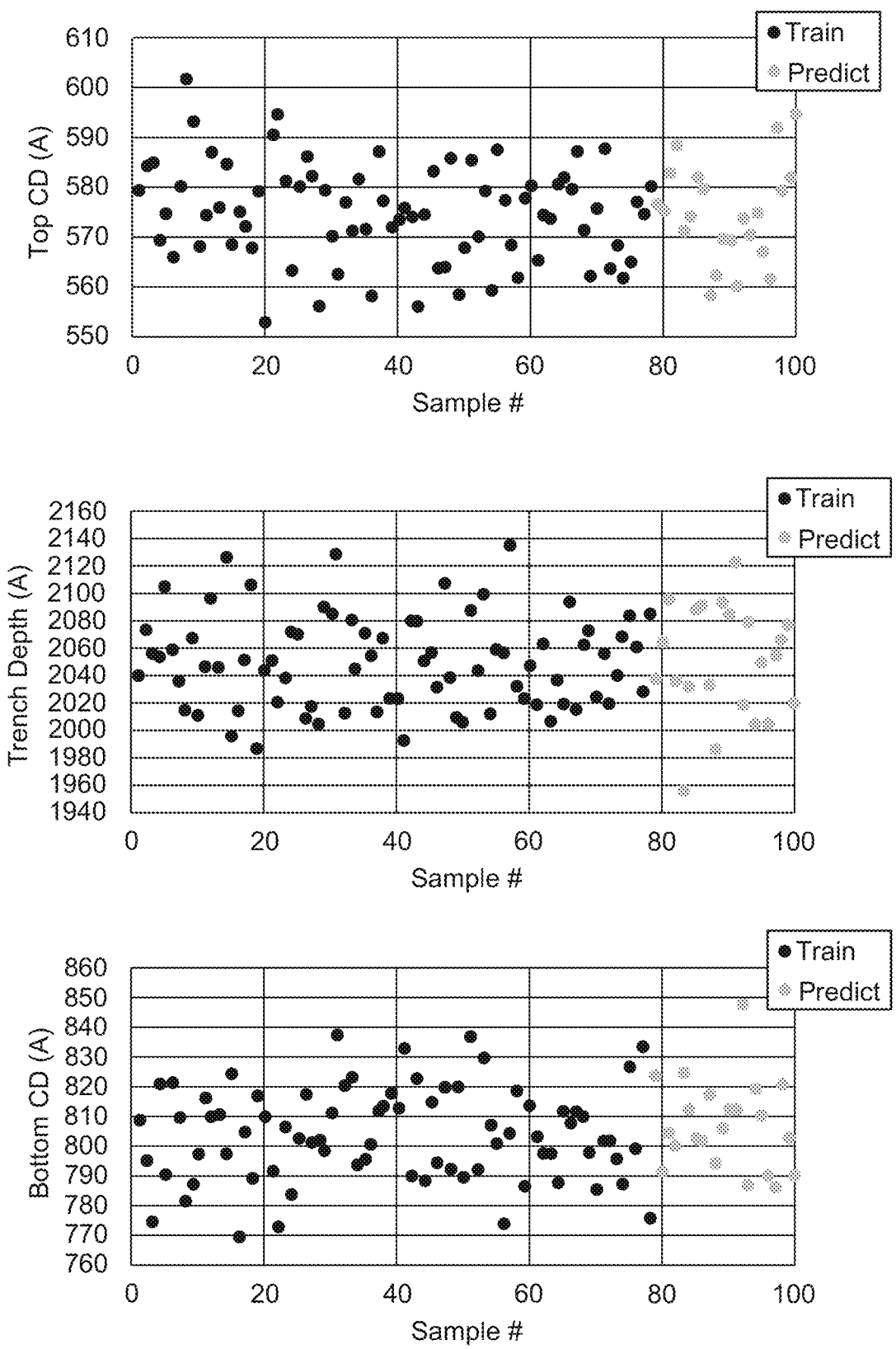
FIG. 10 provides scatter plots illustrating the steps of training and validating a machine-learning algorithm using pre and post-measurements in accordance with an embodiment.

FIG. 10 provides scatter plots illustrating the steps of training and validating a machine-learning algorithm using pre- and post-measurements in accordance with an embodiment. The scatter plots show training and validation data for some of the same parameters measured in the example of FIGS. 8A-8C (top CD, trench depth, bottom CD). This is just an example, and other parameters can be used in training the machine-learning algorithm. The scatter plots in this example show good correlation between the training and validation data.

Figure 11:
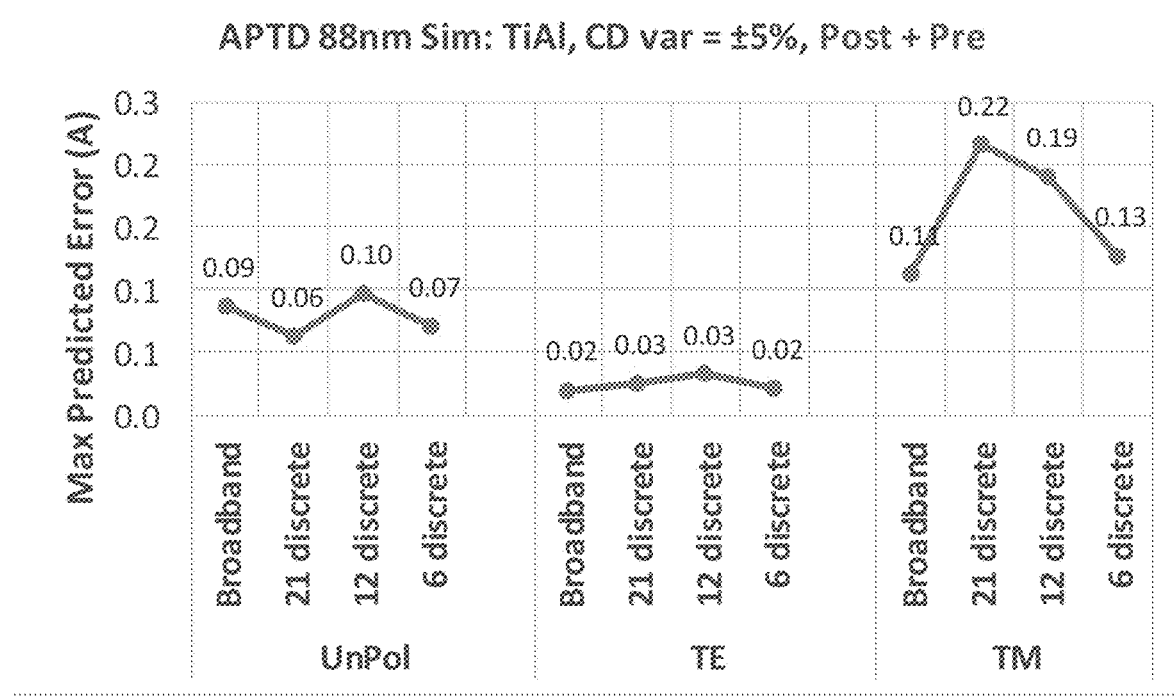
FIG. 11 is a simplified plot of maximum predicted measurement error at different polarization angles using an optical metrology model generated in accordance with some embodiments.

FIG. 11 is a simplified plot of maximum predicted measurement error at different polarization angles using an optical metrology model generated in accordance with some embodiments. The maximum predicted measurement error in this example is of the measured film in FIGS. 8A-8C (TiAl thickness). As discussed with regard to FIG. 8B, the TE polarization provides good sensitivity to the TiAl thickness and reduced sensitivity to the other measured parameters. In this example, a particular wavelength is not selected, but an estimate of the number of discrete wavelengths and the impact on the maximum predicted measurement error is provided. The TE polarization provides the lowest maximum predicted measurement error.

Figure 12:
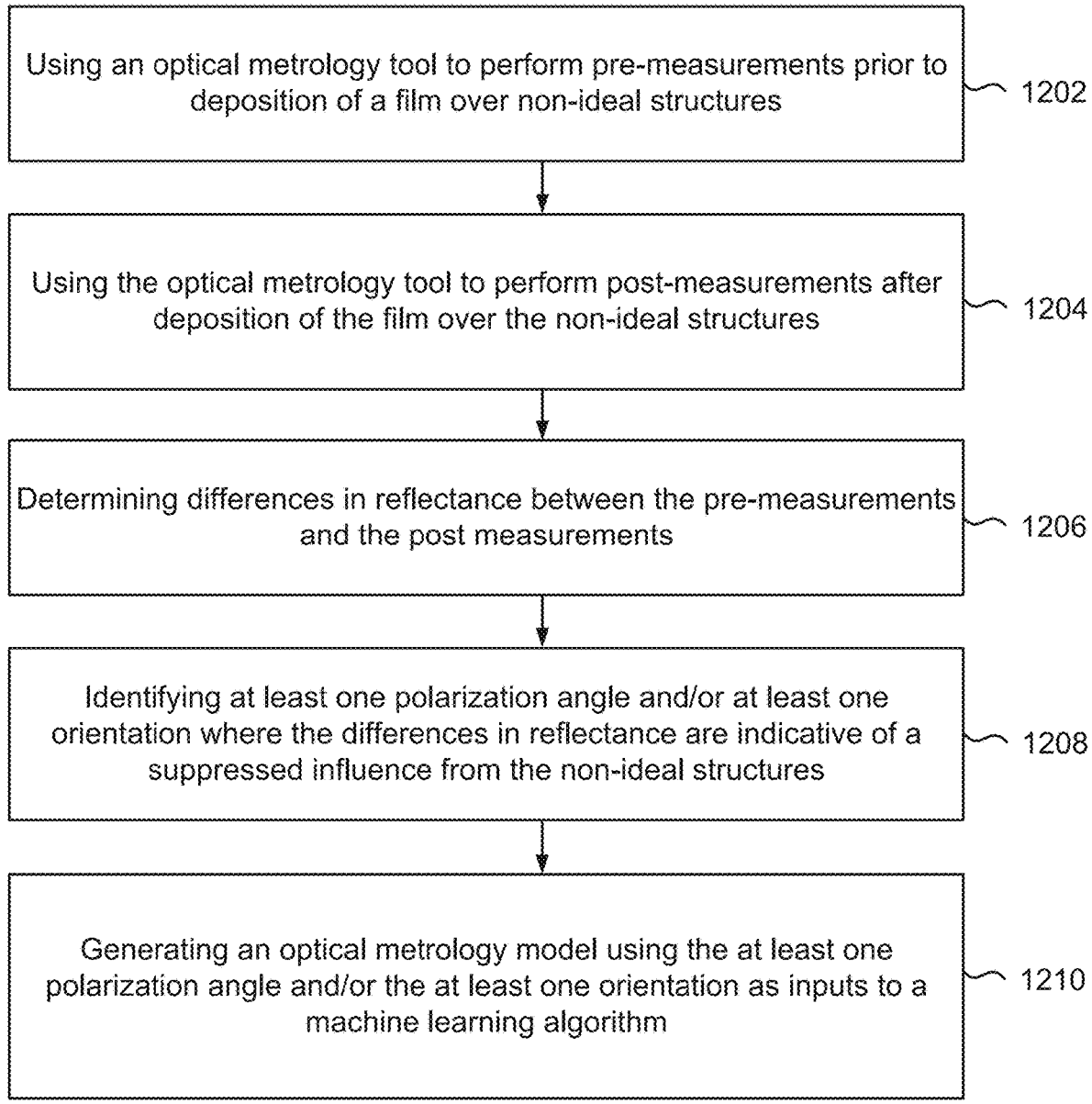
FIGS. 12-13 are flowcharts illustrating some steps for generating optical metrology models for in-line thickness measurements in accordance with some embodiments.

FIG. 12 is a flowchart illustrating some steps for generating an optical metrology model for in-line thickness measurements in accordance with an embodiment. The optical metrology model may be used for thickness measurements of a film overlying non-ideal structures on a semiconductor substrate. The optical metrology model may be used by an optical metrology tool configured for ellipsometry measurements or reflectometry measurements. The optical metrology model may be generated by a computing device that executes instructions stored on a non-transitory computer-readable medium. In some embodiments the computing device may be the optical metrology tool.

The method includes using an optical metrology tool to perform pre-measurements prior to deposition of the film over the non-ideal structures (1202). The pre-measurements may include exposing multiple areas of interest on the semiconductor substrate to electromagnetic radiation and collecting portions of the electromagnetic radiation reflected from the multiple areas of interest. The multiple areas of interest may each include the non-ideal structures, and during the pre-measurements, the multiple areas of interest may be exposed to the electromagnetic radiation at at least one of multiple polarization angles of the electromagnetic radiation or multiple orientations of the semiconductor substrate. The non-ideal structures may have at least one of an unknown shape, a varying width, a varying height, or an unknown orientation. The multiple polarization angles of the electromagnetic radiation include at least a TE polarization state and a TM polarization state.

The method also includes using the optical metrology tool to perform post-measurements after deposition of the film over the non-ideal structures (1204). The post-measurements include exposing the multiple areas of interest on the semiconductor substrate to the electromagnetic radiation and collecting portions of the electromagnetic radiation reflected from the multiple areas of interest. During the post-measurements, the multiple areas of interest may be exposed to the electromagnetic radiation at the same multiple polarization angles of the electromagnetic radiation used during the pre-measurements and the same multiple orientations of the semiconductor substrate used during the pre-measurements.

The method also includes determining differences in reflectance between the pre-measurements and the post-measurements (1206). The differences in reflectance may be between the collected portions of the electromagnetic radiation reflected from the multiple areas of interest during the pre-measurements and the collected portions of the electromagnetic radiation reflected from the multiple areas of interest during the post-measurements. The differences in reflectance may be determined at each of the multiple polarization angles of the electromagnetic radiation and at each of the multiple orientations of the semiconductor substrate. The differences in reflectance may be indicative of a suppressed influence from the non-ideal structures and an enhanced influence from the deposited film.

The method also includes identifying at least one polarization angle and/or at least one orientation where the differences in reflectance are indicative of a suppressed influence from the non-ideal structures (1208). The suppressed influence from the non-ideal structures may be identified as the polarization angle(s) and/or orientation(s) of the semiconductor substrate having relatively small differences in reflectance between the pre- and post-measurements. The at least one polarization angle is determined from the multiple polarization angles of the electromagnetic radiation, and the at least one orientation is from the multiple orientations of the semiconductor substrate.

The method also includes generating the optical metrology model using the at least one polarization angle and/or the at least one orientation as input to a machine-learning algorithm (1210). The method may also include using the optical metrology tool with the optical metrology model for monitoring thickness of a film deposition process on semiconductor substrates.

Figure 13:
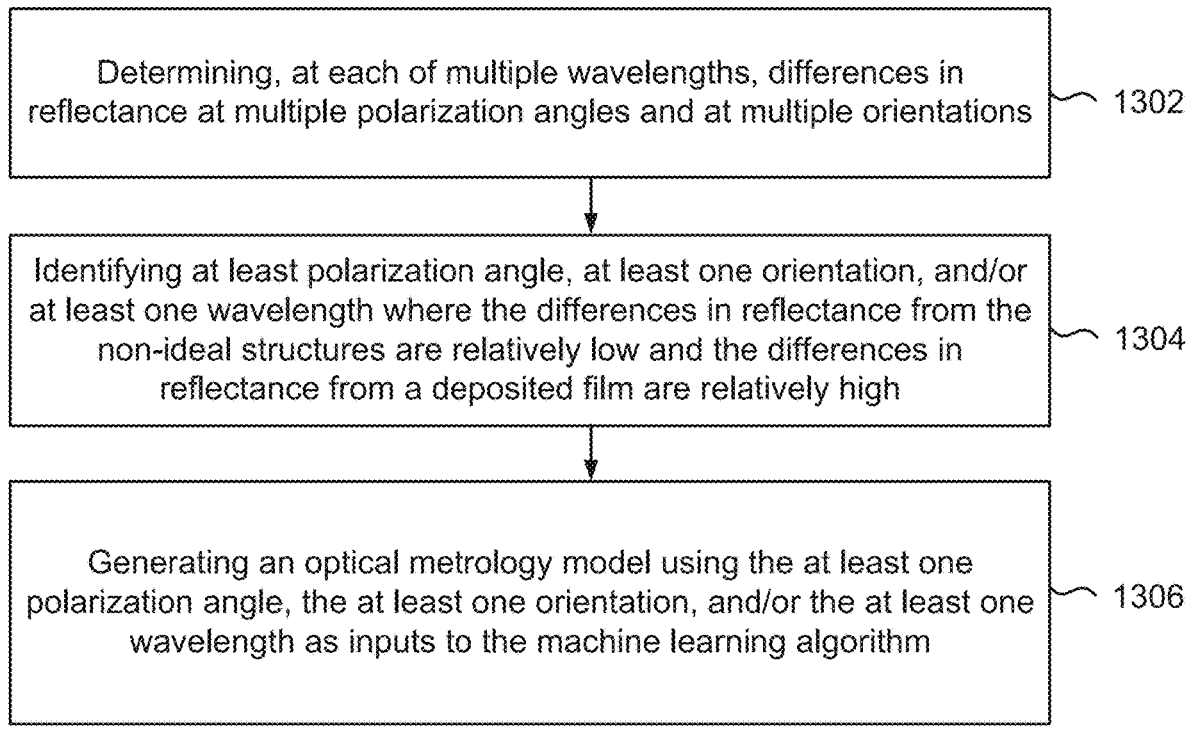

In some embodiments, the method of FIG. 12 may also include the steps illustrated in FIG. 13. For example, the electromagnetic radiation may be provided at multiple wavelengths, and the method may also include determining, at each of the multiple wavelengths, differences in reflectance at the multiple polarization angles and at the multiple orientations (1302).

The method may also include identifying at least one polarization angle, at least one orientation, and/or at least one wavelength where the differences in reflectance from the non-ideal structures are relatively low and the differences in reflectance from the deposited film are relatively high (1304).

The method may also include generating the optical metrology model using the at least one polarization angle, the at least one orientation, and/or the at least one wavelength as inputs to a machine-learning algorithm (1306).

It should be appreciated that the specific steps illustrated in FIGS. 9 and 12-13 provide a particular method for performing reflectometry or ellipsometry measurements according to an embodiment. Other sequences of steps may also be performed according to alternative embodiments. For example, alternative embodiments may perform the steps outlined above in a different order. Moreover, the individual steps illustrated in FIGS. 9 and 12-13 may include multiple sub-steps that may be performed in various sequences. Furthermore, additional steps may be added or removed depending on the particular application.

Figure 14:
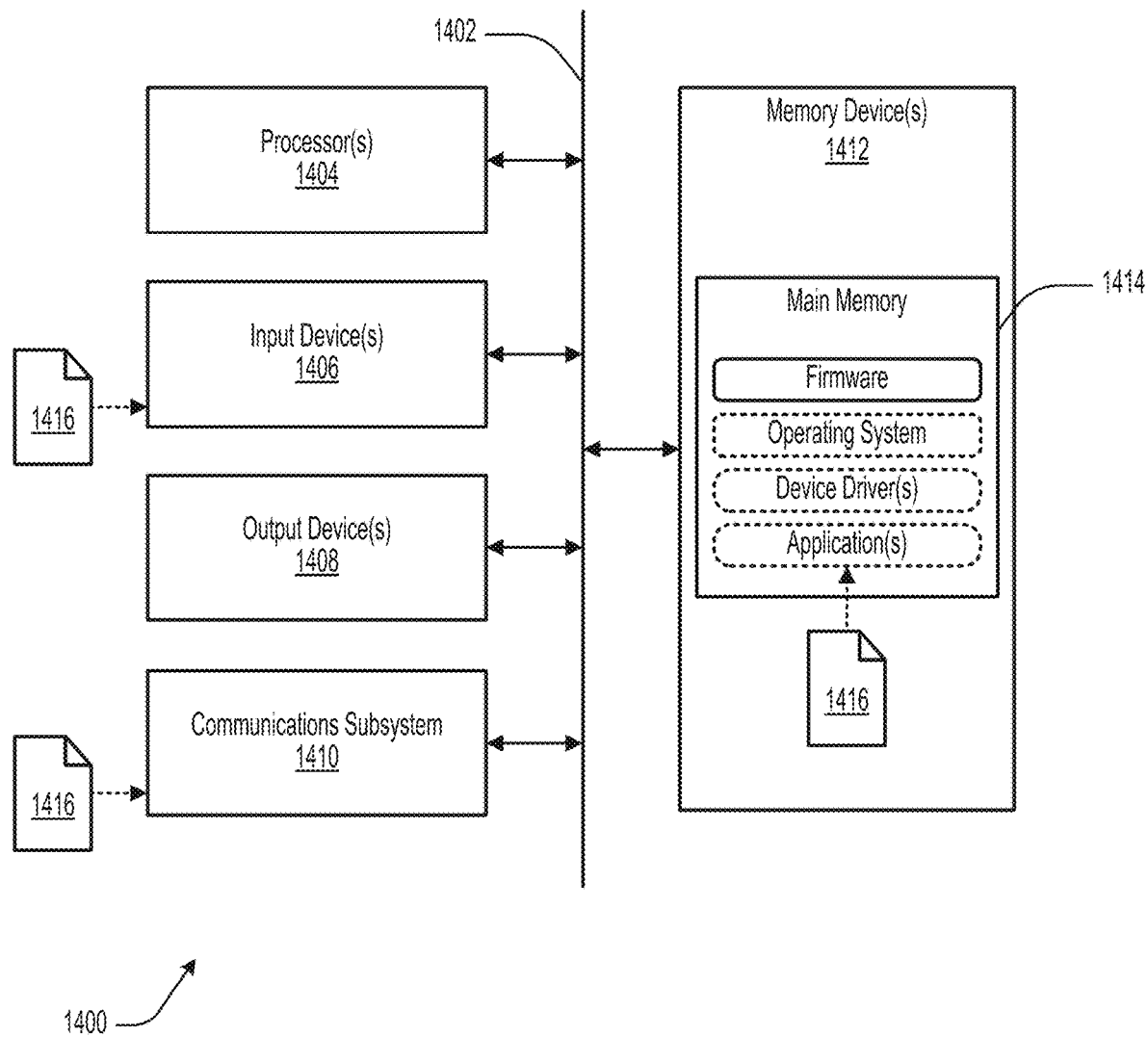
FIG. 14 is a simplified block diagram of an exemplary computer system in accordance with an embodiment.

FIG. 14 is a simplified block diagram of an exemplary computer system in accordance with some embodiments. Computer system 1400 may be incorporated into or integrated with devices and systems described herein (e.g., optical metrology tools) and/or may be configured to perform some or all of the steps of the methods and processes provided by the various embodiments. For example, in various embodiments, computer system 1400 may be configured to perform the steps illustrated in FIGS. 9, 12, and/or 13. It should be noted that FIG. 14 is meant only to provide a generalized illustration of various components, any or all of which may be utilized as appropriate. FIG. 14, therefore, broadly illustrates how individual system elements may be implemented in a relatively separated or relatively more integrated manner.

In the illustrated example, computer system 1400 includes a communication medium 1402, one or more processor(s) 1404, one or more input device(s) 1406, one or more output device(s) 1408, a communications subsystem 1410, and one or more memory device(s) 1412. Computer system 1400 may be implemented using various hardware implementations and embedded system technologies. For example, one or more elements of computer system 1400 may be implemented as a field-programmable gate array (FPGA), such as those commercially available by XILINX®, INTEL®, or LATTICE SEMICONDUCTOR®, a system-on-a-chip (SoC), an application-specific integrated circuit (ASIC), an application-specific standard product (ASSP), a microcontroller, and/or a hybrid device, such as an SoC FPGA, among other possibilities.

The various hardware elements of computer system 1400 may be coupled via communication medium 1402. While communication medium 1402 is illustrated as a single connection for purposes of clarity, it should be understood that communication medium 1402 may include various numbers and types of communication media for transferring data between hardware elements. For example, communication medium 1402 may include one or more wires (e.g., conductive traces, paths, or leads on a printed circuit board (PCB) or integrated circuit (IC), microstrips, striplines, coaxial cables), one or more optical waveguides (e.g., optical fibers, strip waveguides), and/or one or more wireless connections or links (e.g., infrared wireless communication, radio communication, microwave wireless communication), among other possibilities.

In some embodiments, communication medium 1402 may include one or more buses connecting pins of the hardware elements of computer system 1400. For example, communication medium 1402 may include a bus connecting processor(s) 1404 with main memory 1414, referred to as a system bus, and a bus connecting main memory 1414 with input device(s) 1406 or output device(s) 1408, referred to as an expansion bus. The system bus may consist of several elements, including an address bus, a data bus, and a control bus. The address bus may carry a memory address from processor(s) 1404 to the address bus circuitry associated with main memory 1414 in order for the data bus to access and carry the data contained at the memory address back to processor(s) 1404. The control bus may carry commands from processor(s) 1404 and return status signals from main memory 1414. Each bus may include multiple wires for carrying multiple bits of information and each bus may support serial or parallel transmission of data.

Processor(s) 1404 may include one or more central processing units (CPUs), graphics processing units (GPUs), neural network processors or accelerators, digital signal processors (DSPs), and/or the like. A CPU may take the form of a microprocessor, which is fabricated on a single IC chip of metal-oxide-semiconductor field-effect transistor (MOSFET) construction. Processor(s) 1404 may include one or more multi-core processors, in which each core may read and execute program instructions simultaneously with the other cores.

Input device(s) 1406 may include one or more of various user input devices such as a mouse, a keyboard, a microphone, as well as various sensor input devices, such as an image capture device, a multichannel detector, charge coupled device (CCD) detectors, and/or the like. Input device(s) 1406 may also include devices for reading and/or receiving removable storage devices or other removable media. Such removable media may include optical discs (e.g., Blu-ray discs, DVDs, CDs), memory cards (e.g., CompactFlash card, Secure Digital (SD) card, Memory Stick), floppy disks, Universal Serial Bus (USB) flash drives, external hard disk drives (HDDs) or solid-state drives (SSDs), and/or the like.

Output device(s) 1408 may include one or more of various devices that convert information into human-readable form, such as, without limitation, a display device, a speaker, a printer, and/or the like. Output device(s) 1408 may also include devices for writing to removable storage devices or other removable media, such as those described in reference to input device(s) 1406. Output device(s) 1408 may also include various actuators for causing physical movement of one or more components. Such actuators may be hydraulic, pneumatic, electric, and may be provided with control signals by computer system 1400.

Communications subsystem 1410 may include hardware components for connecting computer system 1400 to systems or devices that are located external to computer system 1400, such as over a computer network. In various embodiments, communications subsystem 1410 may include a wired communication device coupled to one or more input/output ports (e.g., a universal asynchronous receiver-transmitter (UART)), an optical communication device (e.g., an optical modem), an infrared communication device, a radio communication device (e.g., a wireless network interface controller, a BLUETOOTH® device, an IEEE 802.11 device, a Wi-Fi device, a Wi-Max device, a cellular device), among other possibilities.

Memory device(s) 1412 may include the various data storage devices of computer system 1400. For example, memory device(s) 1412 may include various types of computer memory with various response times and capacities, from faster response times and lower capacity memory, such as processor registers and caches (e.g., L0, L1, L2), to medium response time and medium capacity memory, such as random access memory, to lower response times and lower capacity memory, such as solid state drives and hard drive disks. While processor(s) 1404 and memory device(s) 1412 are illustrated as being separate elements, it should be understood that processor(s) 1404 may include varying levels of on-processor memory, such as processor registers and caches that may be utilized by a single processor or shared between multiple processors.

Memory device(s) 1412 may include main memory 1414, which may be directly accessible by processor(s) 1404 via the memory bus of communication medium 1402. For example, processor(s) 1404 may continuously read and execute instructions stored in main memory 1414. As such, various software elements may be loaded into main memory 1414 to be read and executed by processor(s) 1404 as illustrated in FIG. 14. Typically, main memory 1414 is volatile memory, which loses all data when power is turned off and accordingly needs power to preserve stored data. Main memory 1414 may further include a small portion of non-volatile memory containing software (e.g., firmware, such as BIOS) that is used for reading other software stored in memory device(s) 1412 into main memory 1414. In some embodiments, the volatile memory of main memory 1414 is implemented as random-access memory (RAM), such as dynamic RAM (DRAM), and the non-volatile memory of main memory 1414 is implemented as read-only memory (ROM), such as flash memory, erasable programmable read-only memory (EPROM), or electrically erasable programmable read-only memory (EEPROM).

Computer system 1400 may include software elements, shown as being currently located within main memory 1414, which may include an operating system, device driver(s), firmware, compilers, and/or other code, such as one or more application programs, which may include computer programs provided by various embodiments of the present disclosure. Merely by way of example, one or more steps described with respect to any methods discussed above might be implemented as instructions 1416, executable by computer system 1400. In one example, such instructions 1416 may be received by computer system 1400 using communications subsystem 1410 (e.g., via a wireless or wired signal carrying instructions 1416), carried by communication medium 1402 to memory device(s) 1412, stored within memory device(s) 1412, read into main memory 1414, and executed by processor(s) 1404 to perform one or more steps of the described methods. In another example, instructions 1416 may be received by computer system 1400 using input device(s) 1406 (e.g., via a reader for removable media), carried by communication medium 1402 to memory device(s) 1412, stored within memory device(s) 1412, read into main memory 1414, and executed by processor(s) 1404 to perform one or more steps of the described methods.

In some embodiments of the present disclosure, instructions 1416 are stored on a computer-readable storage medium, or simply computer-readable medium. Such a computer-readable medium may be non-transitory and may therefore be referred to as a non-transitory computer-readable medium. In some cases, the non-transitory computer-readable medium may be incorporated within computer system 1400. For example, the non-transitory computer-readable medium may include one of memory device(s) 1412, as shown in FIG. 14, with instructions 1416 being stored within memory device(s) 1412. In some cases, the non-transitory computer-readable medium may be separate from computer system 1400. In one example, the non-transitory computer-readable medium may be a removable media provided to input device(s) 1406, such as those described in reference to input device(s) 1406, as shown in FIG. 14, with instructions 1416 being provided to input device(s) 1406. In another example, the non-transitory computer-readable medium may include a component of a remote electronic device, such as a mobile phone, that may wirelessly transmit a data signal carrying instructions 1416 to computer system 1400 using communications subsystem 1416, as shown in FIG. 14, with instructions 1416 being provided to communications subsystem 1410.

Instructions 1416 may take any suitable form to be read and/or executed by computer system 1400. For example, instructions 1416 may be source code (written in a human-readable programming language, such as Java, C, C++, C#, Python), object code, assembly language, machine code, microcode, executable code, and/or the like. In one example, instructions 1416 are provided to computer system 1400 in the form of source code, and a compiler is used to translate instructions 1416 from source code to machine code, which may then be read into main memory 1414 for execution by processor(s) 1404. As another example, instructions 1416 are provided to computer system 1400 in the form of an executable file with machine code that may immediately be read into main memory 1414 for execution by processor(s) 1404. In various examples, instructions 1416 may be provided to computer system 1400 in encrypted or unencrypted form, compressed or uncompressed form, as an installation package or an initialization for a broader software deployment, among other possibilities.

In one aspect of the present disclosure, a system (e.g., computer system 1400) is provided to perform methods in accordance with various embodiments of the present disclosure. For example, some embodiments may include a system comprising one or more processors (e.g., processor(s) 1404) that are communicatively coupled to a non-transitory computer-readable medium (e.g., memory device(s) 1412 or main memory 1414). The non-transitory computer-readable medium may have instructions (e.g., instructions 1416) stored therein that, when executed by the one or more processors, cause the one or more processors to perform the methods described in the various embodiments.

In another aspect of the present disclosure, a computer-program product that includes instructions (e.g., instructions 1416) is provided to perform methods in accordance with various embodiments of the present disclosure. The computer-program product may be tangibly embodied in a non-transitory computer-readable medium (e.g., memory device(s) 1412 or main memory 1414). The instructions may be configured to cause one or more processors (e.g., processor(s) 1404) to perform the methods described in the various embodiments.

In another aspect of the present disclosure, a non-transitory computer-readable medium (e.g., memory device(s) 1412 or main memory 1414) is provided. The non-transitory computer-readable medium may have instructions (e.g., instructions 1416) stored therein that, when executed by one or more processors (e.g., processor(s) 1404), cause the one or more processors to perform the methods described in the various embodiments.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. In addition, technology evolves and, thus, many of the elements are examples and do not limit the scope of the disclosure or claims.

Specific details are given in the description to provide a thorough understanding of exemplary configurations including implementations. However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

While the present invention has been described in terms of specific embodiments, it should be apparent to those skilled in the art that the scope of the present invention is not limited to the embodiments described herein. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description, but with reference to the appended claims along with their full scope of equivalents.

What is claimed is:

1. A method for generating an optical metrology model for in-line thickness measurements of a film overlying non-ideal structures on a semiconductor substrate, the method comprising:

using an optical metrology tool to perform pre-measurements prior to deposition of the film over the non-ideal structures, the pre-measurements comprising exposing multiple areas of interest on the semiconductor substrate to electromagnetic radiation and collecting portions of the electromagnetic radiation reflected from the multiple areas of interest, wherein the multiple areas of interest each include the non-ideal structures, and during the pre-measurements, the multiple areas of interest are exposed to the electromagnetic radiation at at least one of multiple polarization angles of the electromagnetic radiation or multiple orientations of the semiconductor substrate;

using the optical metrology tool to perform post-measurements after deposition of the film over the non-ideal structures, the post-measurements comprising exposing the multiple areas of interest on the semiconductor substrate to the electromagnetic radiation and collecting portions of the electromagnetic radiation reflected from the multiple areas of interest, wherein during the post-measurements, the multiple areas of interest are exposed to the electromagnetic radiation at the same multiple polarization angles of the electromagnetic radiation used during the pre-measurements or the same multiple orientations of the semiconductor substrate used during the pre-measurements;

determining differences in reflectance between the collected portions of the electromagnetic radiation reflected from the multiple areas of interest during the pre-measurements and the collected portions of the electromagnetic radiation reflected from the multiple areas of interest during the post-measurements, wherein the differences in reflectance are determined at each of the multiple polarization angles of the electromagnetic radiation or at each of the multiple orientations of the semiconductor substrate;

identifying at least one polarization angle of the multiple polarization angles of the electromagnetic radiation, or at least one orientation of the multiple orientations of the semiconductor substrate, where the differences in reflectance are indicative of a suppressed influence from the non-ideal structures; and generating the optical metrology model using the identified at least one polarization angle or the identified at least one orientation as input to a machine-learning algorithm.

2. The method of claim 1 wherein the electromagnetic radiation is provided at multiple wavelengths, the method further comprising:

determining, at each of the multiple wavelengths, the differences in reflectance at each of the multiple polarization angles of the electromagnetic radiation or at each of the multiple orientations of the semiconductor substrate;

identifying at least one polarization angle of the multiple polarization angles of the electromagnetic radiation, at least one orientation of the multiple orientations of the semiconductor substrate, or at least one wavelength of the multiple wavelengths where the differences in reflectance from the non-ideal structures are relatively low and the differences in reflectance from the deposited film are relatively high; and generating the optical metrology model using the identified at least one polarization angle, the identified at least one orientation, or the identified at least one wavelength as inputs to a machine-learning algorithm.

3. The method of claim 1 further comprising using the optical metrology tool with the optical metrology model for monitoring thickness of a film deposition process on semiconductor substrates.

4. The method of claim 1 wherein the non-ideal structures on the semiconductor substrate have at least one of an unknown shape, a varying width, a varying height, or an unknown orientation.

5. The method of claim 1 wherein the optical metrology tool is configured for ellipsometry measurements or reflectometry measurements.

6. The method of claim 1 wherein the multiple polarization angles of the electromagnetic radiation include at least a transverse-electric (TE) polarization state and a transverse-magnetic (TM) polarization state.

7. The method of claim 1 wherein the differences in reflectance are identified based on a predicted measurement uncertainty of multi-parameter inverse-model fitting method.

8. A non-transitory computer-readable medium storing instructions that when executed cause a computing device to perform the method according to claim 1.

9. An optical metrology tool and one or more processors configured to perform the method according to claim 1.

10. A method for generating an optical metrology model for in-line thickness measurements of films overlying non-ideal structures on semiconductor substrates, the method comprising:

using an optical metrology tool to perform pre-measurements prior to deposition of the film over the non-ideal structures, the pre-measurements comprising exposing multiple areas of interest on the semiconductor substrates to electromagnetic radiation and collecting portions of the electromagnetic radiation reflected from the multiple areas of interest, wherein the multiple areas of interest each include the non-ideal structures, and during the pre-measurements, the multiple areas of interest are exposed to the electromagnetic radiation at at least one of multiple polarization angles of the electromagnetic radiation or multiple orientations of the semiconductor substrates;

using the optical metrology tool to perform post-measurements after deposition of the film over the non-ideal structures, the post-measurements comprising exposing the multiple areas of interest on the semiconductor substrates to the electromagnetic radiation and collecting portions of the electromagnetic radiation reflected from the multiple areas of interest, wherein during the post-measurements, the multiple areas of interest are exposed to the electromagnetic radiation at the same multiple polarization angles of the electromagnetic radiation used during the pre-measurements or the same multiple orientations of the semiconductor substrates used during the pre-measurements;

determining differences in reflectance between the collected portions of the electromagnetic radiation reflected from the multiple areas of interest during the pre-measurements and the collected portions of the electromagnetic radiation reflected from the multiple areas of interest during the post-measurements, wherein the differences in reflectance are determined at each of the multiple polarization angles of the electromagnetic radiation or at each of the multiple orientations of the semiconductor substrates;

identifying at least one polarization angle of the multiple polarization angles of the electromagnetic radiation, or at least one orientation of the multiple orientations of the semiconductor substrates, where the differences in reflectance are indicative of a suppressed influence from the non-ideal structures and an enhanced influence from the deposited film; and generating the optical metrology model using the identified at least one polarization angle or the identified at least one orientation as input to a machine-learning algorithm.

11. The method of claim 10 wherein the electromagnetic radiation is provided at multiple wavelengths, the method further comprising:

determining, at each of the multiple wavelengths, the differences in reflectance at each of the multiple polarization angles of the electromagnetic radiation or at each of the multiple orientations of the semiconductor substrates;

identifying at least one polarization angle of the multiple polarization angles of the electromagnetic radiation, at least one orientation of the multiple orientations of the semiconductor substrates, or at least one wavelength of the multiple wavelengths where the differences in reflectance from the non-ideal structures are relatively low and the differences in reflectance from the deposited film are relatively high; and generating the optical metrology model using the identified one or more polarization angles, the identified one or more orientations, or the identified one or more wavelengths as input to a machine-learning algorithm.

12. The method of claim 10 wherein the non-ideal structures on the semiconductor substrate have at least one of an unknown shape, a varying width, a varying height, or an unknown orientation.

13. The method of claim 10 wherein the optical metrology tool is configured for optical measurements or spectroscopic measurements.

14. The method of claim 10 wherein the multiple polarization angles of the electromagnetic radiation include at least a transverse-electric (TE) polarization state and a transverse-magnetic (TM) polarization state.

15. A non-transitory computer-readable medium storing instructions that when executed cause a computing device to perform the method according to claim 10.

16. An optical metrology tool and one or more processors configured to generate an optical metrology model for in-line thickness measurements of a film overlying non-ideal structures on a semiconductor substrate, the optical metrology tool and one or more processors configured to perform steps comprising:

performing pre-measurements prior to deposition of the film over the non-ideal structures, the pre-measurements comprising exposing multiple areas of interest on the semiconductor substrate to electromagnetic radiation and collecting portions of the electromagnetic radiation reflected from the multiple areas of interest, wherein the multiple areas of interest each include the non-ideal structures, and during the pre-measurements, the multiple areas of interest are exposed to the electromagnetic radiation at at least one of multiple polarization angles of the electromagnetic radiation or multiple orientations of the semiconductor substrate;

performing post-measurements after deposition of the film over the non-ideal structures, the post-measurements comprising exposing the multiple areas of interest on the semiconductor substrate to the electromagnetic radiation and collecting portions of the electromagnetic radiation reflected from the multiple areas of interest, wherein during the post-measurements, the multiple areas of interest are exposed to the electromagnetic radiation at the same multiple polarization angles of the electromagnetic radiation used during the pre-measurements or the same multiple orientations of the semiconductor substrate used during the pre-measurements;

determining differences in reflectance between the collected portions of the electromagnetic radiation reflected from the multiple areas of interest during the pre-measurements and the collected portions of the electromagnetic radiation reflected from the multiple areas of interest during the post-measurements, wherein the differences in reflectance are determined at each of the multiple polarization angles of the electromagnetic radiation or at each of the multiple orientations of the semiconductor substrate;

identifying at least one polarization angle of the multiple polarization angles of the electromagnetic radiation, or at least one orientation of the multiple orientations of the semiconductor substrate, where the differences in reflectance are indicative of a suppressed influence from the non-ideal structures; and generating the optical metrology model using the identified at least one polarization angle or the identified at least one orientation as input to a machine-learning algorithm.

17. The optical metrology tool and one or more processors of claim 16 wherein the electromagnetic radiation is provided at multiple wavelengths, the optical metrology tool and one or more processors further configured to perform steps comprising:

determining, at each of the multiple wavelengths, the differences in reflectance at each of the multiple polarization angles of the electromagnetic radiation or at each of the multiple orientations of the semiconductor substrate;

identifying at least one polarization angle of the multiple polarization angles of the electromagnetic radiation, at least one orientation of the multiple orientations of the semiconductor substrate, or at least one wavelength of the multiple wavelengths where the differences in reflectance from the non-ideal structures are relatively low and the differences in reflectance from the deposited film are relatively high; and generating the optical metrology model using the identified at least one polarization angle, the identified at least one orientation, or the identified at least one wavelength as input to a machine-learning algorithm.

18. The optical metrology tool and one or more processors of claim 16 wherein the non-ideal structures on the semiconductor substrate have at least one of an unknown shape, a varying width, a varying height, or an unknown orientation.

19. The optical metrology tool and one or more processors of claim 16 wherein the multiple polarization angles of the electromagnetic radiation include at least a transverse-electric (TE) polarization state and a transverse-magnetic (TM) polarization state.

* * * * *